US006346872B1

(12) United States Patent
Greuter et al.

(10) Patent No.: US 6,346,872 B1
(45) Date of Patent: Feb. 12, 2002

(54) METHOD FOR PRODUCING A VARISTOR BASED ON A METAL OXIDE AND A VARISTOR PRODUCED USING THIS METHOD

(75) Inventors: Felix Greuter, Baden-Rütihof; Michael Hagemeister, Zürich; Wolfgang Kluge, Baden-Dättwil, all of (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 09/714,513

(22) Filed: Nov. 17, 2000

Related U.S. Application Data

(62) Division of application No. 09/304,272, filed on May 6, 1999, now Pat. No. 6,199,268.

(30) Foreign Application Priority Data

May 6, 1998 (DE) ........................................ 198 20 134

(51) Int. Cl.[7] .................................................. H01L 7/13
(52) U.S. Cl. .............................. 338/21; 838/20; 838/21
(58) Field of Search ..................... 338/20, 21; 29/610.1

(56) References Cited

U.S. PATENT DOCUMENTS 1,063,303 A * 6/1913 Thomson ..................... 338/21
4,157,527 A * 6/1979 Philipp ........................ 338/21
4,319,215 A * 3/1982 Yamazaki et al. ............ 338/21
4,371,860 A * 2/1983 May et al. ..................... 338/21
4,451,815 A * 5/1984 Sakshaug et al. ............. 338/21
5,264,819 A * 11/1993 Nied et al. ..................... 338/21

* cited by examiner

*Primary Examiner*—Karl D. Easthom
(74) *Attorney, Agent, or Firm*—Burns, Doane, Swecker & Mathis, L.L.P.

(57) ABSTRACT

The method is used to produce a varistor which has a cylindrical resistance body (1) made from a material based on metal oxide, and two electrodes (2, 3) which are each arranged on one of two mutually parallel end faces of the cylindrical resistance body (1). In a first method step, a layer of electrode material is applied to both end faces, as far as their outer boundary (9), which is designed as a sharp edge. In a second method step, a circular ring (4), which is delimited by the outer boundary (9), runs to as far as the end face of the resistance body (1) and has a width of from approx. 10 to 500 μm, is removed from the electrode, or the resistance body (1) and electrode are beveled (5') at the outer boundary.

The method allows simple and economic manufacture of a varistor.

10 Claims, 2 Drawing Sheets

METHOD FOR PRODUCING A VARISTOR BASED ON A METAL OXIDE AND A VARISTOR PRODUCED USING THIS METHOD

This application is a divisional, of application Ser. No. 09/304,272, filed May 6, 1999 now U.S. Pat. No. 6,199,268.

BACKGROUND OF THE INVENTION

1. Field of the Invention

A varistor is used in medium- or high-voltage installations for measurement, protection or control puposes a cylindrical resistance body which is arranged between two parallel electrodes and is made from a sintered ceramic or a polymer which has been highly filled with sintered ceramic granules with a varistor character. The sintered ceramic or the sintered ceramic granules generally comprise(s) a zinc oxide which has been doped in a controlled manner with selected metals, such as Bi, Sb, Co and Mn.

The varistor is preferably used in surge arresters and has to be specified in such a way that it can conduct high-power current pulses which have been produced by lightening strikes or switching operations without being damaged. During the manufacturing process, such current pulses are applied to the electrodes of the varistor, in order to test their capacity to withstand high currents.

2. Discussion of Background

Methods producing such varistors are given in DE 34 05 834 C2 and EP 0,494,507 A1. In each of these methods, a cylindrical, ceramic resistance body based on zinc oxide is produced and an electrode is applied to each of the two parallel, planar end faces of the resistance body.

In the method described in DE 34 05 834 C2, circumferential steps are ground off the resistance body in the peripheral areas of both end faces. Then, the resistance body is provided with an insulating material which covers the circumferential face and the steps. After that, the end faces and some of the insulating material which has been applied to the steps are ground off. Finally, the metal electrodes are applied to the end faces in such a manner that they partly overlap the steps which have been filled with the insulating material but do not reach all the way to the edge of the end face. This method is extremely complex and, in addition, is susceptible to faults, since metal splashes may be formed in the peripheral area when the electrode material is applied, which splashes may lead to dielectric sparkovers when high-field current is applied. In addition, the incomplete coverage of the electrodes results in local overheating of the current density or the electric field in the resistance body, which overheating reduces the dielectric strength of a varistor which has been designed in this way.

In the method described in EP 0,494,507 A1, each of the electrodes is applied all the way to the edge of the end faces of the resistance body. Since, in a varistor of this type, each of the two electrodes extends over the entire end face of the resistance body, a homogenous electric field is formed inside the resistance body when a high current is conducted for a short time. This results in a uniform current density and therefore also in uniform heating of the varistor. Since the unprotected resistance body has sharp edges and points in the area of the outer boundaries of the end faces, and since the electrode material, which runs to as far as the outer boundaries, may pass into the circumferential surface of the resistance body, a ring made from a polymer with a high dielectric constant and with a high temperature stability is positioned on the circumferential surface of the resistance body. This ring ensures that the electric field is reduced in the circumferential surface, thus avoiding undesirable sparkovers. Again, such a method for producing varistors is extremely expensive and complex.

SUMMARY OF THE INVENTION

Accordingly, one object of the invention, as defined in the patent claims, is to provide a novel method of the type mentioned above for the rapid and economic production of a varistor. At the same time, a varistor produced using this method is to have both an excellent energy absorption capacity and a simple structure.

The method according to the invention is distinguished by the fact that it is suitable for series production and that it allows varistors with a high energy absorption capacity and a high capacity to withstand high currents to be manufactured quickly and economically.

The method according to the invention is distinguished by the following method steps:

A layer of electrode material is applied to each of the two end faces of the resistance body, which layer runs as far as the outer boundary of said end faces, and either a circular ring which is delimited by the outer boundary, runs to as far as the end face of the resistance body and has a width of from approx. 10 to approx. 500 $\mu$m is removed from the layer, or the resistance body and, if appropriate, also the layer of electrode material is/are beveled at the outer boundary.

Unlike methods for producing varistors according to the prior art, in which very complicated and expensive processes are used to attempt to avoid the inevitable metallization flaws which occur when the electrode layers are applied, in the method according to the invention these flaws are removed subsequently.

On the one hand, the high energy absorption capacity and the high capacity to withstand high currents of the varistors produced using the method according to the invention stem from the fact that inhomogeneity in the electric field and in the current density in the varistor when a high-powder current pulse occurs are largely avoided as a result of the electrodes running to as close as possible to the outer boundary, which is designed as a sharp edge, of the end faces. Such inhomogeneity may be caused by metallized sharp-edge defects or by metal splashes which extend beyond the edge. Although a narrow electrode-free boundary or a bevel has a slight adverse effect on the ideal, homogenous state with electrodes running all the way to the edges, this measure does efficiently eliminate the considerable inhomogeneity (metallized edge defects which lead to failure).

On the other hand, the high energy absorption capacity and the high capacity to withstand high currents are also consequences of a suitable design of that surface of the varistor which is subjected to high dielectric loads between the two electrodes. In a first preferred embodiment of the varistor, this surface may comprise its cylindrical circumferential surface and two adjoining, circular sections, which are less than 500 $\mu$m wide, of its end faces. In a preferred second embodiment, the surface contains bevels which run directly to the boundary of the electrodes and merge into the cylindrical circumferential surface of the varistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, which show preferred exemplary embodiments of varistors produced using the method according to the invention and in which.

DESCRIPTION OF THE PREFERRED EMBODIMENTS

Figure 1:
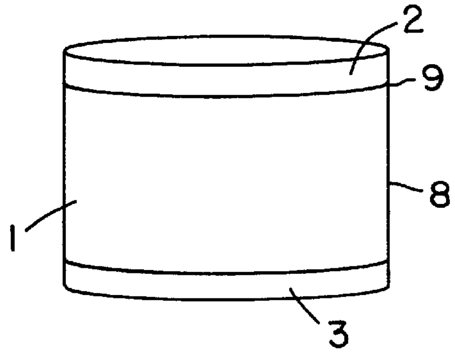
FIG. 1 shows a view of an axial section through a part of a varistor.

Referring now to the drawing, wherein like reference numerals designate identical or corresponding parts throughout the several views, the reference numeral 1 refers to a resistance body made from a ceramic which has a varistor character, is known in the prior art and is produced as follows: Approx. 97 mol % Zn, approx. 0.5 mol % $Bi_2O_3$, approx. 1.0 mol % $Sb_2O_3$, approx. 0.5 mol % $CO_2O_3$, approx. 0.5 mol % $MnO_2$, approx. 0.5 mol % $Cr_2O_3$ and further metal oxide additions were mixed in a ball mill and ground to form a homogenous powder mixture with particle diameters of between approx. 1 and approx. 5 $\mu$m. The powder mixture was suspended in distilled water. In a spray drier, the suspension was converted into flowable, dry granules. The average size of the resultant grains was approx. 100 $\mu$m. Cylindrical pressed bodies were formed from the granules, and from these pressed bodies cylindrical-disk resistance bodies with a diameter of approx. 38 mm and a length of approx. 20 mm were sintered at a temperature of approx. 1200° C. over the course of approx. 2 h.

Electrodes 2 and 3 made from electrode material, such as in particular aluminum, are arranged on the end sides of the resistance body 1. To produce the electrodes 2 and 3, firstly a layer of electrode material, which runs to as far as the outer boundary 9 of the end face, is applied to each of the two end faces (FIG. 1). Advantageously, the electrode material is sprayed on either by flame spraying or by arc application. The result is comparatively porous layers with a thickness of approx. 50–150 $\mu$m. Twenty such varistors were produced. Of these twenty, eight were left unchanged and were used for comparison purposes in tests which are to be described below.

Figure 2:
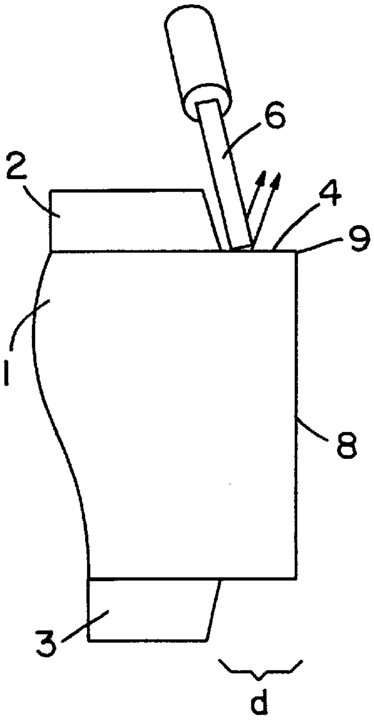
FIG. 2 shows a view of an axial section through a part of a first embodiment of the varistor produced using the method according to the invention, during its manufacture.

Of the remaining twelve varistors, six were modified in accordance with the embodiment shown in FIG. 2. For this purpose, a circular ring 4, which is delimited by the outer boundary 9, runs to as far as the end face of the resistance body and has a thickness d, was removed from the layer. A further six varistors were modified in accordance with the embodiment shown in FIG. 3. In this embodiment, the resistance body 1 and the layer of electrode material were beveled at the outer boundary. The result was a conical bevel 5 on the circumferential surface, which bevel forms an obtuse angle of preferably 100° to 120°, if appropriate up to 150°, with the end face. The removal of the circular ring 4 or the beveling is advantageously carried out by cutting using a gas or liquid jet 6 which is preferably laden with an abrasive powder.

To remove the circular ring 4 in accordance with FIG. 2, the gas or liquid jet 6 is guided onto the electrode 2 at an oblique angle from above. It is thus simple to remove a circular ring with a low thickness d in the area of the end face. The circular ring is removed after the electrodes have been applied. A porous electrode material can be attacked particularly effectively by the gas or liquid jet 6 and removed without leaving behind dielectrically undesirable pitting or cracks. In order to be able to maintain good dielectric properties, the circular ring should be at most 500 $\mu$m, preferably at most 300 $\mu$m, from the outer boundary 9 of the end face bearing the electrode material. A short distance of at least 10 $\mu$m, preferably at least 20 $\mu$m, ensures that inhomogeneity in the electrodes or abrasion of electrode material cannot reduce the dielectric strength of the varistor.

When beveling in accordance with FIG. 3, the gas or liquid jet 6 is guided onto the resistance body 1 and the electrode 2 at an oblique angle from below. This ensures that the electrode material removed by beveling cannot move onto the conical bevel 5 of the circumferential surface and therefore cannot have an adverse effect on the dielectric properties of the varistor. Instead of using a gas or liquid jet 6, the bevel can also be produced by grinding.

In a test appliance, a plurality of approximately rectangular current pulses with a duration of 2 ms and an amplitude of several 100 A were applied to the twenty varistors. Then, the test resistors were examined visually. This examination established that half of the eight varistors in accordance with FIG. 1 had suffered a defect, whereas the varistors designed in accordance with FIGS. 2 and 3 had remained completely able to function.

Figure 3:
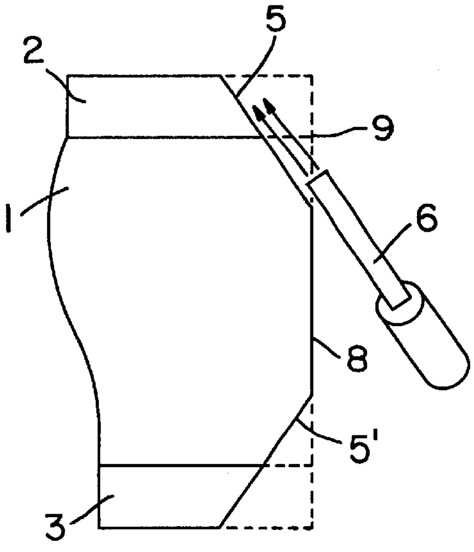
FIG. 3 shows a view of an axial section through a part of a second embodiment of the varistor produced using the method according to the invention, during its manufacture.
Figure 4:
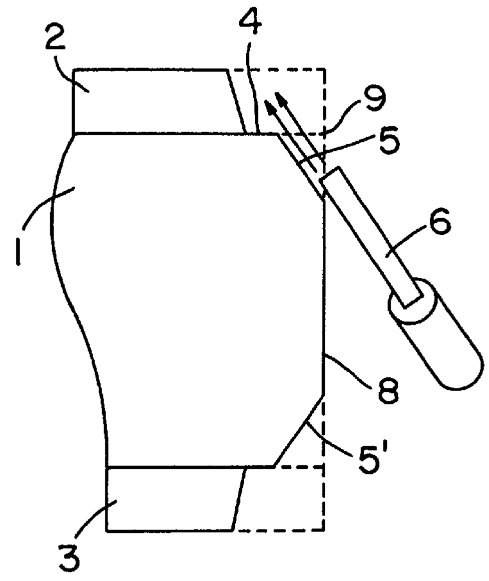
FIG. 4 shows a view of an axial section through a part of a third embodiment of the varistor produced using the method according to the invention, during its manufacture.

FIG. 4 shows a varistor during manufacture, in which varistor a combination of the methods in accordance with FIG. 2 and FIG. 3 is used, in that firstly the circular ring 4 is removed in accordance with FIG. 2 and then the conical bevel 5 is produced in accordance with FIG. 3.

Figure 5:
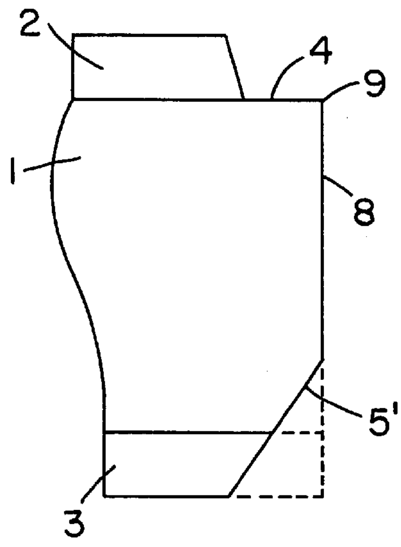
FIG. 5 shows a view of an axial section through a part of a fourth embodiment of the varistor produced using the method according to the invention.

For the second side of the varistor, it is possible either to use the same method as for the first side (FIG. 2, FIG. 3 and FIG. 4) or to use one of the other two methods (FIG. 5).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A varistor capable of withstanding at least one high-power current pulse of defined amplitude, form and duration in an electric field of predetermined magnitude, the varistor comprising:

a cylindrical resistance body made from a material which is based on metal oxide; and two electrodes each arranged on one of two mutually parallel end faces of the cylindrical resistance body;

wherein for each of the two electrodes, an outer circumference of the electrode is between approximately 10 microns and approximately 500 microns distant from a boundary defined as an intersection of a plane defined by the end face on which the electrode is arranged, with a surface defined by a circumferential outer surface of the cylindrical resistance body; and wherein the resistance body has a first conical bevel extending from the electrode on one of the first and second end faces to the circumferential outer surface of the resistance body.

2. The varistor of claim 1, wherein the resistance body has a second conical bevel extending from the electrode on the other one of the first and second end faces to the circumferential outer surface of the resistance body.

3. The varistor of claim 1, wherein the outer circumference of the electrode is beveled with respect to the circumferential outer surface of the cylindrical resistance body.

4. A varistor capable of withstanding at least one high-power current pulse of defined amplitude, form and duration in an electric field of predetermined magnitude, the varistor comprising:

a cylindrical resistance body made from a material which is based on metal oxide; and two electrodes each arranged on one of two mutually parallel end faces of the cylindrical resistance body;

wherein for each of the two electrodes, an outer circumference of the electrode is between approximately 10 microns and approximately 500 microns distant from a boundary defined as an intersection of a plane defined by the end face on which the electrode is arranged, with a surface defined by a circumferential outer surface of the cylindrical resistance body; and wherein the resistance body has a first conical bevel extending from one of the first and second end faces to the circumferential outer surface of the resistance body.

5. A varistor capable of withstanding at least one high-power current pulse of defined amplitude, form and duration in an electric field of predetermined magnitude, the varistor comprising:

a cylindrical resistance body made from a material which is based on metal oxide; and two electrodes each arranged on one of two mutually parallel end faces of the cylindrical resistance body;

wherein the resistance body has a first conical bevel extending from the electrode on one of the first and second end faces to the circumferential outer surface of the resistance body, and wherein the electrode on one of the first and second end faces does not cover the surface of the first conical bevel.

6. The varistor of claim 5, wherein the first conical bevel forms an obtuse angle with the corresponding end face.

7. The varistor of claim 6, wherein the obtuse angle is greater than or equal to 100 degrees and less than or equal to 150 degrees.

8. The varistor of claim 6, wherein the obtuse angle is greater than or equal to 100 degrees and less than or equal to 120 degrees.

9. The varistor of claim 5, wherein the first bevel is continuous.

10. A varistor capable of withstanding at least one high-power current pulse of defined amplitude, form and duration in an electric field of predetermined magnitude, the varistor comprising:

a cylindrical resistance body made from a material which is based on metal oxide; and two electrodes each arranged on one of two mutually parallel end faces of the cylindrical resistance body;

wherein an outer circumference of a first one of the electrodes is between approximately 10 microns and approximately 500 microns distant from a boundary defined as an intersection of the end face on which the first electrode is arranged, with a circumferential outer surface of the cylindrical resistance body, and wherein the resistance body has a conical bevel extending from the second one of the electrodes to the circumferential outer surface of the cylindrical resistance body.

* * * * *